(12) United States Patent
Blu et al.

(10) Patent No.: US 8,326,580 B2
(45) Date of Patent: Dec. 4, 2012

(54) SPARSE SAMPLING OF SIGNAL INNOVATIONS

(75) Inventors: Thierry Blu, Tai Po (HK); Martin Vetterli, Grandvaux (CH); Lionel Coulot, Le Lignon (CH)

(73) Assignee: QUALCOMM Incorporated, San Diego, CA (US)

( * ) Notice: Subject to any disclaimer, the term of this patent is extended or adjusted under 35 U.S.C. 154(b) by 623 days.

(21) Appl. No.: 12/139,117

(22) Filed: Jun. 13, 2008

(65) Prior Publication Data

US 2009/0191814 A1    Jul. 30, 2009

Related U.S. Application Data

(60) Provisional application No. 61/024,490, filed on Jan. 29, 2008, provisional application No. 61/056,565, filed on May 28, 2008.

(51) Int. Cl.
*H03F 1/26* (2006.01)

(52) U.S. Cl. ........... 702/189; 375/316; 375/355; 702/69

(58) Field of Classification Search .................... 702/17, 702/69, 71, 74, 111, 127, 189, 191; 327/100; 375/130, 260, 285, 316, 322, 355; 455/41.3, 455/63.1; 381/74, 94.1; 708/814
See application file for complete search history.

(56) References Cited

U.S. PATENT DOCUMENTS

| | | | |
|---|---|---|---|
| 7,365,577 B2 * | 4/2008 | Schneider et al. | ............ 327/100 |
| 7,388,935 B2 | 6/2008 | Hui | |
| 2002/0141504 A1 | 10/2002 | Suzuki et al. | |
| 2003/0072360 A1 | 4/2003 | Liang et al. | |
| 2004/0210617 A1 | 10/2004 | Vetterli et al. | |
| 2006/0193371 A1 | 8/2006 | Maravic | |
| 2007/0140380 A1 | 6/2007 | Ferreol et al. | |
| 2007/0143078 A1 | 6/2007 | Vetterli et al. | |
| 2008/0181284 A1 | 7/2008 | Husted et al. | |
| 2009/0190689 A1 | 7/2009 | Blu et al. | |
| 2010/0177906 A1 | 7/2010 | Vetterli et al. | |
| 2010/0239103 A1 | 9/2010 | Barbotin | |
| 2010/0240309 A1 | 9/2010 | Barbotin et al. | |
| 2011/0103500 A1 | 5/2011 | Vetterli et al. | |

FOREIGN PATENT DOCUMENTS

| | | |
|---|---|---|
| JP | 2004532550 A | 10/2004 |
| KR | 20030035771 A | 5/2003 |
| KR | 20050113869 A | 12/2005 |
| WO | 02078197 A2 | 10/2002 |

OTHER PUBLICATIONS

Blu et al., Sparse Sampling of Signal Innovations, 2008, IEEE Signal Processing Magazine, vol. 25, Issue: 2, pp. 31-40.

(Continued)

*Primary Examiner* — John H Le (74) *Attorney, Agent, or Firm* — Dang M. Vo; John G. Rickenbrode (57) ABSTRACT

The present invention relates to a method of processing a signal which is received by a receiver, comprising, obtaining an analog signal $(y_t)$ based on another signal $(x_t)$ and noise; defining a sampling kernel based on the noise; and using the sampling kernel to obtain at least one sample $(y_n)$ from the analog signal $(y_t)$. The invention also relates to a corresponding apparatus; computer program product; headset; watch, and sensing device.

43 Claims, 6 Drawing Sheets

OTHER PUBLICATIONS

Dragotti et al., Sampling Moments and Reconstructiong Signals of Finite Rate of Innovation: Shannon Meets Strang-Fix, 2007, IEEE Transactions on Signal Processing, vol. 55, No. 7, pp. 1741-1757.

Seelamantula et al., A Generalized Sampling Method for Finite-Rate-of-Innovation-Signal Reconstruction, 2008, IEEE Signal Processing Letters, vol. 15, pp. 81 3-81 6.

Tan et al., Estimating Signals With Finite Rate of Innovation From Noisy Samples: A Stochastic Algorithm, 2008, IEEE Transactions on Signal Processing, vol. 56, Issue: 10, pp. 5135-5146.

Berent et al., Sampling Piecewise Sinusoidal Signals With Finite Rate of Innovation Methods, Feb. 2010, Signal Processing, IEEE Transactions on, vol. 58, Issue 2, pp. 613-625.

Hormati A et al: "Annihilating filter-based decoding in the compressed sensing framework", Proceedings of SPIE vol. 6701, Wavelets XII, Aug. 26, 2007, San Diego, CA, USA, vol. 6701, 2007, pp. 670121-1-670121-10, XP55023298, ISSN: 0277-786X, DOI: 10.1117/12.732308.

International Search Report and Written Opinion—PCT/US2008/067163—ISA/EPO—Apr. 5, 2012.

Jovanovic I et al: "Oversampled A/D conversion and error-rate dependence of nonbandlimited signals with finite rate of innovation", IEEE Transactions on Signal Processing, vol. 54, No. 6, Jun. 2006, pp. 2140-2154, XP55023339, ISSN: 1053-587X, DOI: 10.1109/TSP.2006.874363 abstract section III.

Maravic I et al: "Sampling and reconstruction of signals with finite rate of innovation in the presence of noise", IEEE Transactions on Signal Processing, vol. 53, No. 8, 2005, pp. 2788-2805, XP009133639, ISSN: 1053-587X sections I and III.

Martin Vetterli, et al., "Sampling Signals With Finite Rate of Innovation", IEEE Transactions on Signal Processing, Jun. 2002, pp. 1417-1428, vol. 50, No. 6.

Vetterli M: "Sampling sparse signals at Occams rate", Slides of a presentation given on Sep. 6, 2007 at the 15th European Signal Processing Conference (EUSIPCO 2007), Sep. 3-7, 2007, Poznan, Poland, (Sep. 6, 2007), XP55023297, Retrieved from the Internet: URL: http://Icay.epfl.ch/files/content/sites/Icav/files/Martin Vetterli/Talks/eusipco2007.pdf [retrieved on Mar. 29, 2012]slides 26 to 30.

\* cited by examiner

SPARSE SAMPLING OF SIGNAL INNOVATIONS

CLAIM OF PRIORITY UNDER 35 U.S.C. §119

This application claims the benefit of and priority to commonly owned U.S. Provisional Patent Application No. 61/024,490, filed Jan. 29, 2008, and U.S. Provisional Patent Application No. 61/056,565, filed May 28, 2008, the disclosure of each of which is hereby incorporated by reference herein.

CROSS-REFERENCE TO RELATED APPLICATION

This application is related to concurrently filed and commonly owned U.S. patent application Ser. No. 12/139,079, entitled "SPARSE SAMPLING OF SIGNAL INNOVATIONS," disclosure of which is hereby incorporated by reference herein.

BACKGROUND

1. Field

This application relates generally to signal processing and more specifically, but not exclusively, to wireless telecommunication, signal acquisition and reconstruction.

2. Introduction

Signal acquisition and reconstruction is at the heart of signal processing, and sampling theorems provide the bridge between continuous time phenomena and discrete-time representations of such phenomena. A well-known sampling theorem is often attributed to Shannon, and gives a sufficient condition, namely bandlimitedness, for an exact sampling and interpolation formula. The minimal sampling rate, at twice the bandwidth of the analog signal, is typically referred to as the Nyquist rate.

The Shannon case is a particular example, where any signal from the subspace of bandlimited signals denoted by BL, can be acquired through sampling and perfectly interpolated from the samples. Using the sinc kernel, or ideal lowpass filter, non-bandlimited signals will be projected onto the subspace BL.

International Patent Application WO 02/078197, which is hereby incorporated by reference, develops sampling schemes for a larger class of non-bandlimited signals, such as streams of Diracs, non-uniform splines and piecewise polynomials. A common feature of these signals is that they have a parametric representation with a finite number of degrees of freedom (or a number which is finite in each period), and can be perfectly reconstructed from a finite set of samples.

SUMMARY

A summary of sample aspects of the disclosure follows. It should be understood that any reference to the term aspects herein may refer to one or more aspects of the disclosure.

The disclosure relates in some aspects to acquiring signals, including signals from outside of the subspace of bandlimited signals associated with the Shannon theorem, while still providing an acceptable reconstruction. In some aspects this may involve taking advantage of some sort of sparsity in the signal being reconstructed. Through the use of sparse sampling at a rate characterized by how sparse signal components are per unit of time, the Nyquist constraints may be avoided while accurately sampling and reconstructing signals. In some aspects, sampling is performed at the rate of innovation of the signal.

The disclosure relates in some aspects to using a denoising process in conjunction with sparse sampling techniques. For example, a denoising process utilizing a Cadzow algorithm may be used to reduce the amount of noise associated with sampled information. In some aspects the denoising process may be iterative such that the denoising process is repeated until the samples are denoised to a sufficient degree. This denoising process is especially useful when applied to signal sampled at sub-Nyquist rates, but can also be used with bandlimited signals sampled at rates higher than Nyquist.

In some aspects, the denoising process converts a set of received samples into another set corresponding to a signal with a Finite Rate of Innovation (FRI), or to an approximation of such a signal. The denoising process thus removes or reduces at least one component of the noise, i.e., the component that makes the signal have a non Finite Rate of Innovation. In one aspect, the parameters (amplitude (weight) and location (phase, shift)) of the set of samples delivered by the denoising process may still be noisy, but the signal-to-noise ratio is improved by this process.

The output of an infinite number of iterations of Cadzow is thus not only "denoised" but is actually a signal with a Finite Rate of Innovation, very unlike the noisy signal. By using a sufficient number of Cadzow iterations, the output may be an FRI signal (e.g., on the order of 1e-10). Such an FRI signal may equivalently be represented, either by a sequence of uniform samples, or by the set of parameters (innovations) that provide these samples. The switch between the two representations is performed by using an annihilation filter technique. In the disclosed approach this technique may be reduced to be the inverse operation of the sampling operation.

For the retrieval of a parametric model, a subspace technique can be used. In particular, the matrix of coefficients derived from the samples has a structure and rank condition which can be taken advantage of. As an example, the matrix of Fourier coefficients is Toeplitz and has rank K when there are K Diracs in the time domain signal. Thus, a singular value decomposition can be used to get a rank K approximation to the noisy matrix, which is a subspace approximation.

The disclosure relates in some aspects to a method where a signal with a non Finite Rate of Innovation, for example a noisy signal, can be acquired through sampling and projected onto the subspace of signals with a Finite Rate of Innovation, allowing a perfect or at least improved interpolation from the samples.

The disclosure relates in some aspects to determining the number of samples to obtain from a signal over a period of time based on noise associated with the signal. For example, the number of samples may be selected based on the known or assumed signal-to-noise ratio, and/or on the desired accuracy of the reconstructed signal.

The disclosure relates in some aspects to determining (e.g., defining) a sampling kernel to be used to sample the signal based on noise associated with the signal. For example, the amount and type of noise in a signal may affect the bandwidth of a sampling kernel and/or the type of a sampling kernel to be used to sample the signal. The bandwidth of the sampling kernel, in turn, may affect the number of samples to acquire.

The disclosure relates in some aspects to determining the finite number of innovations of a received signal. For example, a number of innovations of a signal may be determined based on at least one rank of at least one matrix that is defined based on the received signal. In some aspects such a matrix may be associated with an annihilation filter.

The disclosure also relates in some aspects to combination of a denoising process with annihilating filter methods in order to retrieve information from a noisy, sparse sampled signal.

BRIEF DESCRIPTION OF THE DRAWINGS

These and other sample aspects of the disclosure will be described in the detailed description and the appended claims that follow, and in the accompanying drawings, wherein:

In accordance with common practice the various features illustrated in the drawings may not be drawn to scale. Accordingly, the dimensions of the various features may be arbitrarily expanded or reduced for clarity. In addition, some of the drawings may be simplified for clarity. Thus, the drawings may not depict all of the components of a given apparatus (e.g., device) or method. Finally, like reference numerals may be used to denote like features throughout the specification and figures.

DETAILED DESCRIPTION

Various aspects of the disclosure are described below. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

Figure 1:
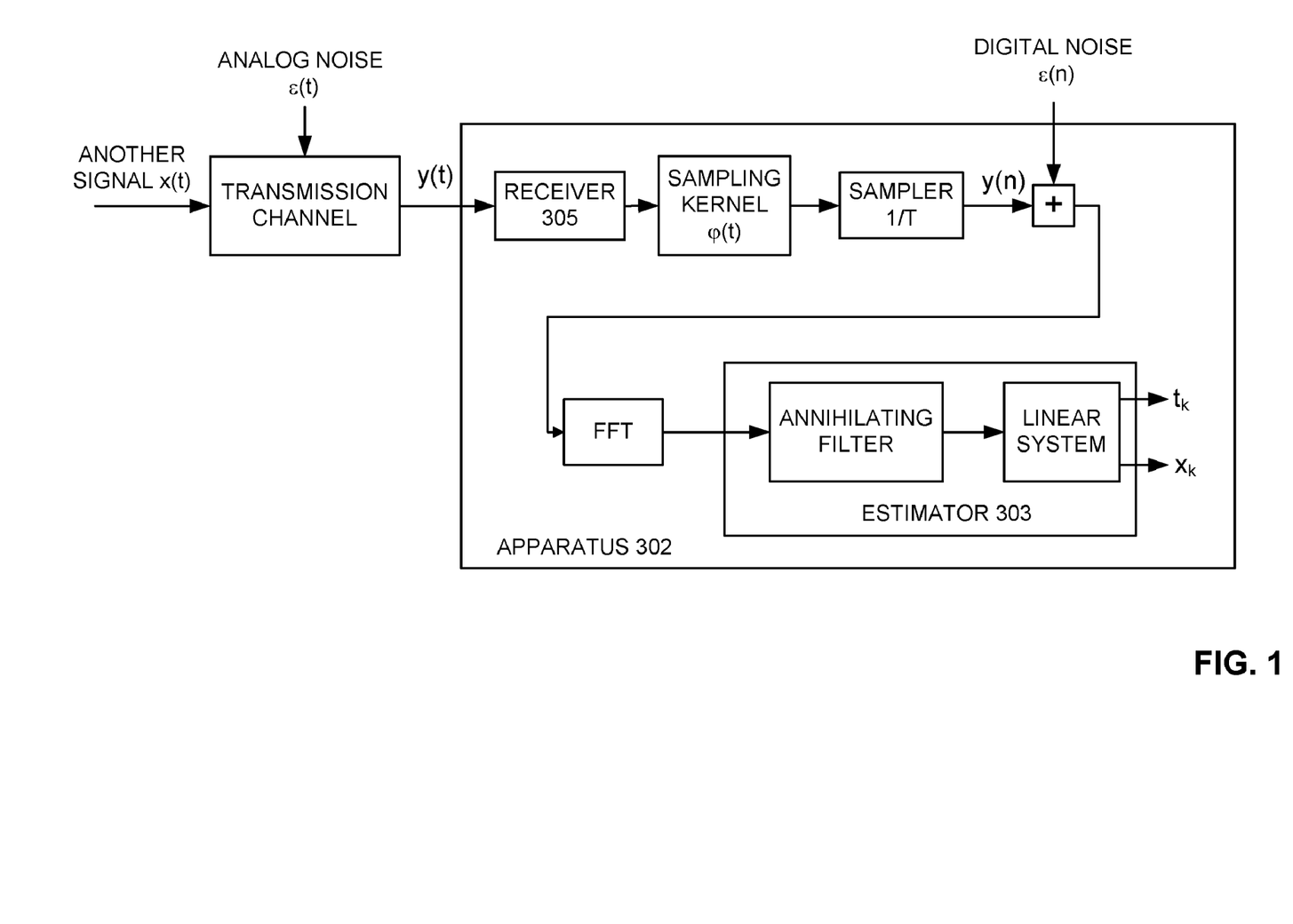
FIG. 1 is a simplified block diagram of several sample aspects of a communication receiver, with schematic indications of potential noise perturbations in the analog part and in the digital part.
Figure 2:
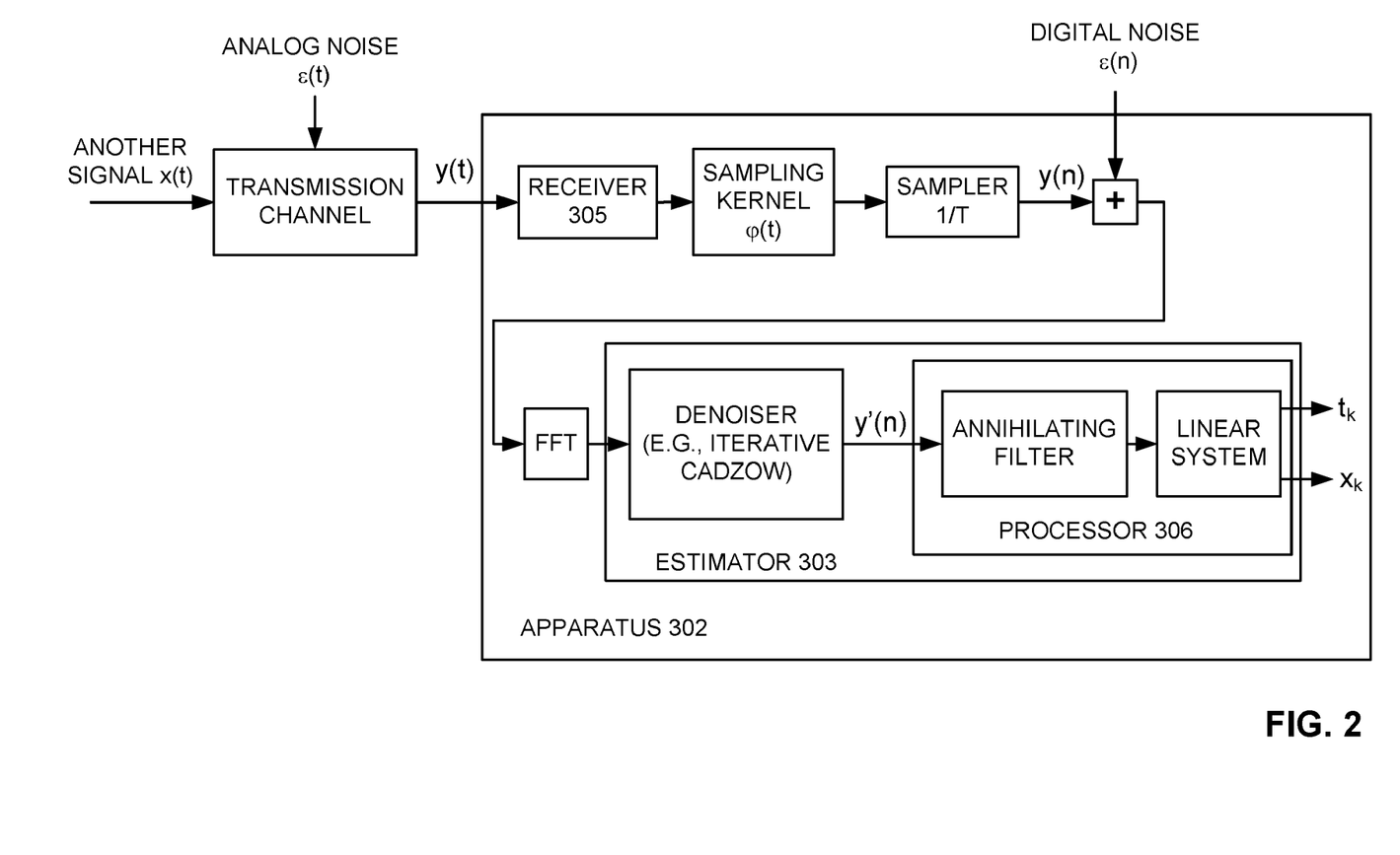
FIG. 2 is a simplified block diagram of several sample aspects of a communication receiver, with schematic indications of potential noise perturbations in the analog part and in the digital part.

Referring initially to FIGS. 1 and 2, the sampling and reconstruction scheme of the present disclosure will be described in a theoretical manner. FIG. 1 relates to a system that may be employed for a noiseless case and, potentially, for a substantially noiseless case (e.g., where the effect of noise may be ignored or will be automatically compensated). The system comprises a transmission channel which possibly adds an analog noise $\epsilon(t)$ to a transmitted signal (the "another" signal) x(t). The analog signal y(t) transmitted over the transmission channel is received by a suitable receiver 305 in an apparatus 302. The receiver 305 may comprise for example an antenna and a radiofrequency part (not shown). In some aspects, the apparatus 302 may comprise a sampler that samples a received signal y(t) using a sampling kernel. For example, in FIG. 1 the received signal y(t) is filtered by a suitable sampling kernel $\phi(t)$, for example a sinc filter, with a suitable bandwidth. The filtered signal is then sampled at a sample frequency 1/T, and possibly quantized. It should be appreciated that in some aspects the sampler may comprise at least a portion of the sampling filter. In some aspects at least one of: the receiver 305, the sampling kernel (e.g., a filter based on the sampling kernel), or the sampler may be implemented in a circuit in the apparatus 302.

The quantization process, error corrections or various perturbations in the receiver 305 or elsewhere in the apparatus 302 may add a digital noise $\epsilon(n)$ to the sampled signal y(n) (which may be referred to herein as $y_n$). Here, it should be appreciated that the "addition block" is simply intended to illustrate, for example, that at some point digital noise $\epsilon(n)$ may be imparted on the sampled signal y(n) whereby the input to an estimator 303 may be a composite signal comprising y(n) and $\epsilon(n)$. In the example illustrated in FIG. 1, the analog noise $\epsilon(t)$ and the digital noise $\epsilon(n)$ are both null or at least low compared to the signal, so that a denoising process may not be needed, as will be described.

In order to reconstruct the original signal x(t), the sampled signal y(n) with the additional digital noise $\epsilon(n)$ is then converted in the frequency domain, using for example a Fast Fourier Transformation (FFT) or another suitable transformation. An annihilating filter, as part of the estimator 303, is then computed in order to retrieve shifts $t_k$, and then weights $x_k$, by resolving a linear system in the estimator. The original signal x(t) may then be accurately reconstructed from the set of retrieved innovations $t_k$, $x_k$ (e.g., from estimates of the shifts and weights). In some cases, a complete reconstruction of the another signal x(t) (which may be referred to herein as $x_t$) is not required and it may be sufficient to retrieve some information ("innovations") corresponding to this signal, for example only the shifts $t_k$, only the weights $x_k$, and/or other information relating to x(t).

FIG. 2 relates to a system that may be employed for the case of noisy signals. Comparing with FIG. 1, in this system the estimator 303 also comprises a denoiser for replacing the sampled signal y(n) (or the FFT transform of this signal) by an approximation with no or less noise, i.e. a "denoised" sequence of samples ($y'_n$). In this context, "denoised" means that at least a part of the noise has been removed or reduced. A denoiser is thus an apparatus, part or software module that converts a noisy signal into another signal from which a better, less noisy estimation of the required information can be computed.

In the example of FIG. 2, the annihilating filter and the linear system are shown as being implemented in a processor component 306. The weights $x_k$ and shifts $t_k$, or other information relating to the another signal x(t), are thus retrieved from the denoised signal y'(n) (which may be referred to herein as $y'_n$) using a similar annihilating filter and by solving a similar linear system. The denoising may be applied to the samples in the time domain or, as illustrated, in the frequency domain after a suitable transformation such as a Fast Fourier Transformation (FFT).

In the aspects of FIGS. 1 and 2, the sampling rate 1/T used for sampling the (filtered) received signal y(t) (which may be referred to herein as $y_t$) may be sub-Nyquist, i.e. lower than the minimal sampling rate given by the Shannon theorem applied to the another signal x(t) and/or to the received signal y(t), while still allowing an accurate or (if the signal-to-noise ratio is sufficient) even perfect reconstruction of the another signal x(t). One of the options associated with the sampling rate is to choose it higher than the finite rate of innovation ρ of the another signal x(t). The method thus even applies to a non bandlimited signal, such as a sequence of Diracs, a rectangular signal, a piecewise polynomial signal, any signal with a finite duration and finite number of innovations during this duration, any periodic signal with a finite number of innovations during each period, etc., or to a signal y(t) that includes a noise component making it not bandlimited.

The sampling rate 1/T used for sampling the received signal y(t) thus depends mainly on the rate of innovation of the another signal x(t). This rate of innovation may be previously known, estimated, assumed, or retrieved from the signal itself, for example in a receiver. The sampling rate also depends on the level of noise ϵ(t) and ϵ(n), for example on the signal-to-noise ratio, which may also be previously known, estimated, assumed, or retrieved from the received signal. In addition, the determination of the sampling rate depends on the desired level of accuracy of the information one wants to retrieve. In an aspect, the determination of the sampling rate is based on a comparison between the signal-to-noise ratio of the reconstructed signal with an assumption of an expected signal to noise ratio. Thus, in some aspects the sampling rate may be defined before the receipt of the another signal x(t) by the apparatus 302. In some aspects the apparatus 302 (e.g., one or more of the estimator, the receiver, the sampler, or a dedicated rate determination circuit) may determine the sampling rate based on an estimate of the noise (e.g., estimated signal to noise ratio), a desired level of accuracy, a comparison of signal to noise ratios, or the rate of innovation (e.g., based on K which may be determined as discussed below).

The sampling kernel φ(t), in particular the bandwidth and/or function used as a sampling kernel, may also depend on the rate of innovation of the another signal x(t) and/or on noise, or on the signal-to-noise ratio, or on the type of noise, or more generally on an estimate of the analog noise ϵ(t) and/or digital noise ϵ(n). Thus, in some aspects the apparatus 302 (e.g., one or more of the estimator, the receiver, the sampler, or a dedicated kernel defining circuit) may define the kernel (e.g., by adjusting the bandwidth of an adjustable kernel filter) based on the noise (e.g., an estimate of noise) or the rate of innovation (e.g., based on K which may be determined as discussed below).

Figure 3:
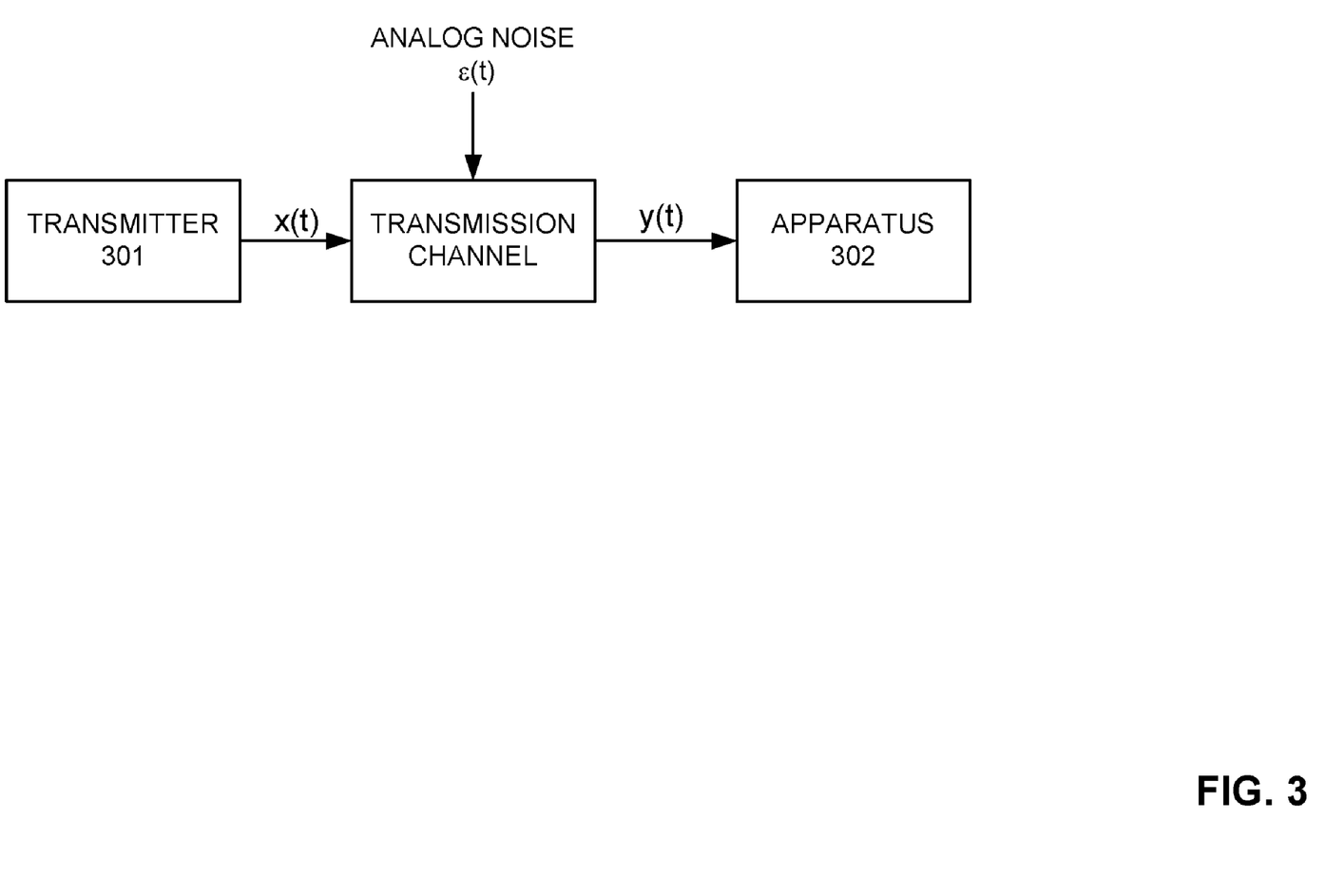
FIG. 3 is a simplified block diagram of several sample aspects of a communication system.

Sample implementations of this scheme will be described in conjunction with FIG. 3. FIG. 3 illustrates a communication system with a transmitter 301 that sends an analog signal x(t) over a noisy communication channel, for example a wireless or wired communication channel. An apparatus 302 receives a signal y(t) based on x(t) and on noise ϵ(t) added by the communication channel (e.g., the signal y(t) is a composite signal comprising x(t) and ϵ(t)), and retrieves information corresponding to x(t) by sampling y(t) at a sub-Nyquist rate, possibly denoising the sampled signal, and applying suitable annihilating filter and linear system estimation methods as described below.

Signals with Finite Rate of Innovation

Using the sinc kernel (defined as sinc t=sin πt/πt), a signal x(t) bandlimited to [−B/2,B/2] may be expressed as set forth in Equation 1:

$$x(t) = \sum_{k \in Z} x_k \operatorname{sinc}(Bt - k) \quad (1)$$

where $x_k = \langle B \operatorname{sinc}(Bt-k), x(t) \rangle = x(k/B)$.

Alternatively, it may be said that the signal x(t) has B degrees of freedom per second, since x(t) is exactly defined by a sequence of real numbers $\{x_k\}_{k \in Z}$, spaced T=1/B seconds apart. This may be referred to as the rate of innovation of the bandlimited process, denoted by ρ, and equal to B.

A generalization of the space of bandlimited signals is the space of shift-invariant signals. Given a basis function φ(t) that is orthogonal to its shifts by multiples of T, or <φ(t−kT), φ(t−k'T)>=$\delta_{k-k'}$, the space of functions obtained by replacing sinc with φ in (1) defines a shift-invariant space S. For such functions, the rate of innovation is again equal to ρ=1/T.

For a generic sparse source, such as a Poisson process, which is a set of Dirac pulses, $\Sigma_{k \in Z} \delta(t-t_k)$, where $t_k - t_{k-1}$ is exponentially distributed with p.d.f. $\lambda e^{-\lambda t}$. Here, the innovations are the set of positions (or shifts) $\{t_k\}_{k \in Z}$. Thus, the rate of innovation is the average number of Diracs per unit of time: $\rho = \lim_{T \to \infty} C_T/T$, where $C_T$ is the number of Diracs in the interval [−T/2, T/2]. This parallels the notion of information rate of a source based on the average entropy per unit of time introduced by Shannon. In the Poisson case with decay rate λ, the average delay between two Diracs is 1/λ; thus, the rate of innovation ρ is equal to λ.

A generalization involves weighted Diracs, as set forth in Equation 2:

$$x(t) = \sum_{k \in Z} x_k \delta(t - t_k) \quad (2)$$

By similar arguments, ρ=2λ in this case, since both positions (shifts) and weights are degrees of freedom.

A sampling theorem for the type of sparsely sampled signals is described below where ρ samples per unit of time are acquired, which perfectly describe the original signal, thereby allowing a perfect reconstruction of the original signal, as with the Shannon sampling procedure but with less samples or a lower sampling rate.

According to one aspect, the sampling rate should be (at least) ρ, the rate of innovation of the original signal. To show that that is sufficient can be done in a number of cases of interest. The archetypal sparse signal is the sum of Diracs, observed through a suitable sampling kernel. In this case, sampling theorems at the rate of innovation can be proven. Beyond the question of a representation theorem, efficient computational procedures, showing the practicality of the approach are described. Next, the question of robustness to noise and optimal estimation procedures under these conditions is addressed. Here, algorithms to estimate sparse signals in noise that achieve performance close to optimal will be described. This may be done by computing Cramer-Rao bounds that indicate the best performance of an unbiased estimation of the innovation parameters. Note that, when the Signal-to-Noise ratio is poor, the algorithms are iterative, and thus trade computational complexity for estimation performance. For convenience, Table 1 sets forth several notations that are used herein.

TABLE 1

| Symbol | Meaning |
| --- | --- |
| x(t), τ, $\hat{x}_m$ | τ-periodic Finite Rate of Innovation signal and its Fourier coefficients |
| K, $t_k$, $x_k$ and ρ | Innovation parameters: $x(t) = \sum_{k=1}^{K} x_k \delta(t - t_k)$, for t ∈ [0, τ] and rate of innovation of the signal: ρ = 2K/τ |
| φ(t), B | "Anti-aliasing" filter, prior to sampling: typically φ(t) = sinc Bt Note: B × τ is restricted to be an odd integer |

TABLE 1-continued

| Symbol | Meaning |
| --- | --- |
| $y_n, \hat{y}_m, N, T$ | (noisy) samples $\{y_n\}_{n=1,2,\ldots,N}$ of $(\varphi^* x)(t)$ at multiples of $T = \tau/N$ (see Equation 15) and its DFT coefficients $\hat{y}_m$ |
| A, L | rectangular annihilation matrix with L + 1 columns (see Equation 13) |
| $H(z,), h_k$ and H | Annihilating filter: z-transform, impulse response and vector representation |

Sampling Signals at their Rate of Innovation

A $\tau$-periodic stream of K Diracs $\delta(t)$ with amplitudes $x_k$ located at times $t_k \in [0, \tau]$ may be represented as:

$$x(t) = \sum_{k=1}^{K} \sum_{k' \in Z} x_k \delta(t - t_k - k'\tau) \quad (3)$$

This signal x(t) is convolved with a sinc-window of bandwidth B, where B$\tau$ is an odd integer, and is uniformly sampled with sampling period T=$\tau$/N. We want to retrieve the innovations $x_k$ and $t_k$ in the original signal from the n=1, 2, ..., N measurements:

$$y_n = \langle x(t), \operatorname{sinc}(B(nT-t))\rangle = \sum_{k=1}^{K} x_k \varphi(nT - t_k) \quad (4)$$

where $$\varphi(t) = \sum_{k' \in Z} \operatorname{sinc}(B(t - k'\tau)) = \frac{\sin(\pi B t)}{B\tau \sin(\pi t/\tau)} \quad (5)$$

is the $\tau$-periodic sinc function or Dirichlet kernel. Here, x(t) has a rate of innovation $\rho = 2K/\tau$. During each period $\tau$, the weight $x_k$ and shifts $t_k$ each take K values.

It is desirable to provide a sampling scheme that is able to retrieve the innovations of x(t) by operating at a sampling rate that is as close as possible to $\rho$.

Since x(t) is periodic, we can use the Fourier series to represent it. The Fourier series coefficients of x(t) are thus:

$$x(t) = \sum_{m \in Z} \hat{x}_m e^{j2\pi mt/\tau}, \text{ where } \hat{x}_m = \frac{1}{\tau} \sum_{k=1}^{K} x_k \underbrace{e^{-j2\pi m t_k/\tau}}_{u_k^m} \quad (6)$$

In this noiseless case, the signal x(t) is completely determined by the knowledge of the K amplitudes (weights) $x_k$ and the K locations (shifts) $t_k$, or equivalently, by the knowledge of $u_k$. By considering 2K contiguous values of $\hat{x}_m$ in Equation 6, a system of 2K equations in 2K unknowns may be constructed that is linear in the weights $x_k$, but is highly nonlinear in the locations $t_k$ and therefore cannot be solved using classical linear algebra. Such a system, however, admits a unique solution when the Diracs locations are distinct, which is obtained by using an annihilating filter method as discussed below.

Call $\{h_k\}_{k=0, 1, \ldots, K}$ the filter coefficients with z-transform:

$$H(z) = \sum_{k=0}^{K} h_k z^{-k} = \prod_{k=1}^{K}(1 - u_k z^{-1}) \quad (7)$$

That is, the roots of H(z) correspond to the locations $u_k = e^{-j2\pi t_k/\tau}$. It follows that:

$$\begin{aligned} h * \hat{x}_m &= \sum_{k=0}^{K} h_k \hat{x}_{m-k} \\ &= \sum_{k=0}^{K} \sum_{k'=1}^{K} \frac{x_{k'}}{\tau} h_k u_{k'}^{m-k} \\ &= \sum_{k'=1}^{K} \frac{x_{k'}}{\tau} u_{k'}^{m} \underbrace{\sum_{k=0}^{K} h_k u_{k'}^{-k}}_{H(u_{k'})=0} \\ &= 0 \end{aligned} \quad (8)$$

The filter $h_m$ may thus be referred to as annihilating filter since it annihilates the discrete signal $\hat{x}_m$. The zeros of this filter uniquely define the locations $t_k$ of the Diracs. Since $h_0 = 1$, the filter coefficients $h_m$ are found from (8) by involving at least 2K consecutive values of $\hat{x}_m$, leading to a linear system of equations; e.g., if we have $\hat{x}_m$ for m=-K, -K+1, ..., K-1, this system can be written in square Toeplitz matrix form as follows:

$$\begin{bmatrix} \hat{x}_{-1} & \hat{x}_{-2} & \ldots & \hat{x}_{-K} \\ \hat{x}_0 & \hat{x}_{-1} & \ldots & \hat{x}_{-K+1} \\ \vdots & \vdots & \ddots & \vdots \\ \hat{x}_{K-2} & \hat{x}_{K-3} & \ldots & \hat{x}_{-1} \end{bmatrix} \begin{bmatrix} h_1 \\ h_2 \\ \vdots \\ h_K \end{bmatrix} = - \begin{bmatrix} \hat{x}_0 \\ \hat{x}_1 \\ \vdots \\ \hat{x}_{K-1} \end{bmatrix} \quad (9)$$

If the $x_k$'s do not vanish, this K×K system of equations has a unique solution because any $h_m$ satisfying it is also such that $H(u_k)=0$ for k=1, 2, ... K. Given the filter coefficients $h_m$, the locations $t_k$ are retrieved from the zeros $u_k$ of the z-transform in (7). The weights $x_k$ are then obtained by considering, for instance, K consecutive Fourier-series coefficients as given in (6). By writing the expression of these K coefficients in vector form, a Vandermonde system of equations is provided which yields a unique solution for the weights $x_k$ since the $u_k$'s are distinct. Here, no more than 2K consecutive coefficients $\hat{x}_m$ may be needed to solve both the Toeplitz system (9) and the Vandermonde system. This confirms that the knowledge of only 2K Fourier-series coefficients is sufficient to retrieve x(t).

Next, the Fourier-series coefficients $\hat{x}_m$ are related to the actual measurements $y_n$. Assume $N \geq B\tau$ then, for n=1, 2, ..., N:

$$y_n = \langle x(t), \operatorname{sinc}(Bt - n)\rangle = \sum_{|m| \leq \lfloor B\tau/2 \rfloor} T \hat{x}_m e^{j2\pi mn/N} \quad (10)$$

Up to a factor NT=$\tau$, this is simply the inverse Discrete Fourier Transform (DFT) of a discrete signal bandlimited to $[-\lfloor B\tau/2 \rfloor, \lfloor B\tau/2 \rfloor]$ and which coincides with $\hat{x}_m$ in this bandwidth. As a consequence, the discrete Fourier coefficients of $y_n$ provide $B\tau$ consecutive coefficients of the Fourier series of $x(t)$ according to Equation 11:

$$\hat{y}_m = \sum_{n=1}^{N} y_n e^{-j2\pi mn/N} \quad (11)$$
$$= \begin{cases} \tau \hat{x}_m & \text{if } |m| \le \lfloor B\tau/2 \rfloor \\ 0 & \text{for other } m \in [-N/2, N/2] \end{cases}$$

Summarizing, at least 2K consecutive coefficients $\hat{x}_m$ are needed to use the annihilating filter method, this means that $B\tau \ge 2K$. Thus, the bandwidth of the sinc-kernel, B, is always larger than $2K/\tau = \rho$, the rate of innovation. However, since $B\tau$ is odd, the minimum number of samples per period is actually one sample larger: $N \ge B_{min}\tau = 2K+1$ which is the next best thing to critical sampling. Moreover, this reconstruction algorithm is fast and does not involve any iterative procedures. Typically, the only step that depends on the number of samples, N, is the computation of the DFT coefficients of the samples $y_n$, which can be implemented in $O(N \log_2 N)$ elementary operations using the FFT algorithm. All the other steps of the algorithm (in particular, polynomial rooting) depend on K only; i.e., on the rate of innovation $\rho$.

Equation 8 indicates that any non-trivial filter $\{h_k\}_{k=0,1,\ldots,L}$ where $L \ge K$ that has $u_k = e^{-j2\pi t_k/\tau}$ as zeros will annihilate the Fourier series coefficients of $x(t)$. The converse is true: any filter with transfer function $H(z)$ that annihilates the $\hat{x}_m$ is automatically such that $H(u_k)=0$ for $k=1, 2, \ldots, K$. Taking Equation 11 into account, this means that for such filters:

$$\sum_{k=0}^{L} h_k \hat{y}_{m-k} = 0, \text{ for all } |m| \le \lfloor B\tau/2 \rfloor \quad (12)$$

These linear equations may be expressed using a matrix formalism: let A be the Toeplitz matrix:

$$A = \begin{bmatrix} \hat{y}_{-M+L} & \hat{y}_{-M+L-1} & \cdots & \hat{y}_{-M} \\ \hat{y}_{-M+L+1} & \hat{y}_{-M+L} & \cdots & \hat{y}_{-M+1} \\ \hat{y}_{-M+L+2} & \hat{y}_{-M+L+1} & \ddots & \vdots \\ \vdots & & \ddots & \hat{y}_{-M+L} \\ \vdots & & \ddots & \vdots \\ \hat{y}_M & \hat{y}_{M-1} & \cdots & \hat{y}_{M-L} \end{bmatrix} \begin{matrix} \overbrace{\phantom{xxxxxxxxxx}}^{L+1 \text{ columns}} \\ 2M-L+1 \text{ rows}, \end{matrix} \quad (13)$$

where $M = \lfloor B\tau/2 \rfloor$ and $H = [h_0, h_1, \ldots, h_L]^T$ the vector containing the coefficients of the annihilating filter, then Equation 12 is equivalent to:

$$AH=0 \quad (14)$$

which can be seen as a rectangular extension of Equation 9. Note that, unlike Equation 7, H is not restricted to satisfy $h_0=1$. Now, if we choose $L > K$, there are $L-K+1$ independent polynomials of degree L with zeros at $\{u_k\}_{k=1,2,\ldots,K}$, which means that there are $L-K+1$ independent vectors H which satisfy Equation 14. As a consequence, the rank of the matrix A does never exceed K. This provides a simple way to determine K when it is not known a priori: find the smallest L such that the matrix A built according to (13) is singular, then $K=L-1$.

The annihilation property of Equation 12 satisfied by the DFT coefficients $\hat{y}_m$ is narrowly linked to the periodized sinc-Dirichlet window used prior to sampling. This approach may be generalized to other kernels such as for example the (non-periodized) sinc, the Gaussian windows, and any window that satisfies a Strang-Fix like condition, i.e., the reproduction of polynomials.

Finite Rate Innovation (FRI) Signals with Noise

"Noise", or more generally model mismatch are unfortunately omnipresent in data acquisition, making the solution presented in the previous section an ideal case. As shown on FIGS. 1 and 2, perturbations to the FRI model may arise both in the analog domain during, e.g., a transmission procedure, and in the digital domain during and after sampling—in this respect, quantization is a source of noise as well.

According to an aspect of the disclosure, an increase in the sampling rate is performed to achieve robustness against noise.

Consider the signal resulting from the convolution of a $\tau$-periodic FRI signal (Equation 3) and a sinc-window of bandwidth B, where $B\tau$ is an odd integer. Due to noise corruption, Equation 4 becomes:

$$y_n = \sum_{k=1}^{K} x_k \varphi(nT - t_k) + \varepsilon_n \text{ for } n = 1, 2, \ldots, N \quad (15)$$

where $T=\tau/N$ and $\varphi(t)$ is the Dirichlet kernel (Equation 5). Given that the rate of innovation of the signal is $\rho$, consider $N > \rho\tau$ samples to fight the perturbation $\varepsilon_n$, making the data redundant by a factor of $N/(\rho\tau)$. Algorithms that may be applied to efficiently exploit this extra redundancy will now be discussed.

One approach utilizes the Total Least-Squares approximation (implemented using a Singular Value Decomposition), optionally enhanced by an initial "denoising" (or "model matching") step provided by what is referred to herein as Cadzow's iterated algorithm. The full algorithm, depicted in FIG. 2, is also detailed below in its two main components.

By computing the theoretical minimal uncertainties known as Cramer-Rao bounds on the innovation parameters, it may be seen that these algorithms exhibit a quasi-optimal behavior down to noise levels of the order of 5 dB (depending on the number of samples). In particular, these bounds are instructive in how to choose the bandwidth of the sampling kernel.

Total Least-Squares Method

In the presence of noise, the annihilation Equation 14 is not satisfied exactly, yet it is still reasonable to expect that the minimization of the Euclidian norm $\|AH\|^2$ under the constraint that $\|H\|^2=1$ may yield a close estimate of H. Of particular interest is the solution for $L=K$—annihilating filter of minimal size—because the K zeros of the resulting filter provide a unique estimation of the K locations $t_k$. It can be shown that this minimization can be solved by performing a singular value decomposition of A as defined by Equation 13—more exactly: an eigenvalue decomposition of the matrix $A^T A$—and choosing for H the eigenvector corresponding to the smallest eigenvalue. More specifically, if $A=USV^T$ where U is a $(B\tau-K)\times(K+1)$ unitary matrix, S is a $(K+1)\times(K+1)$ diagonal matrix with decreasing positive elements, and V is a $(K+1)\times(K+1)$ unitary matrix, then H is the last column of V. Once the shifts $t_k$ are retrieved, the weights $x_k$ follow from a least mean square minimization of the difference between the samples $y_n$ and the FRI model (Equation 15).

We will now describe a possible aspect of the total least square method for retrieving the innovations $x_k$ and $t_k$ from the noisy samples of Equation 15. The method could comprise following steps:

1) Compute the N-DFT coefficients of the samples $$\hat{y}_m = \sum_{n=1}^{N} y_n e^{-j2\pi mn/N};$$

2) Choose L=K and build a rectangular Toeplitz matrix A according to Equation 13;
3) Perform a singular value decomposition of the matrix A, and choose the eigenvector $[h_0, h_1, \ldots, h_L]^T$ corresponding to the smallest eigenvalue—i.e., the annihilating filter coefficients;
4) Compute the roots $e^{-j2\pi t_k/\tau}$ of the z-transform $$H(z) = \sum_{k=0}^{K} h_k z^{-k}$$

and deduce $\{t_k\}_{k=1,\ldots,K}$;
5) Compute the least mean square solution $x_k$ of the N equations $$\{y_n - \Sigma_k x_k \phi(nT - t_k)\}_{n=1,2,\ldots,N}.$$

Extra Denoising: Cadzow

The total least-square algorithm works quite well for moderate values of the noise—a level that depends on the number of Diracs. However, for small signal-to-noise ratios (SNR), the results may become unreliable and it is advisable to apply a robust denoising process. In one aspect, the denoising process "projects" the noisy samples onto the sampled FRI model of Equation 15. It thus replaces the noisy digital samples by an approximation of the noiseless signal, or by a signal which may still be noisy (less noisy), but which has a finite rate of innovation, or is closer to a signal with a finite rate of innovation.

In one aspect, when the samples $y_n$ are very noisy, it is preferable to first denoise them by performing at least one iteration of Cadzow's algorithm before applying the above described total least square method or another method for retrieving the parameters $(t_k, x_k)$ of the other signal.

The Cadzow process delivers a FRI signal, or substantially FRI signal, that can equivalently be represented, either by a sequence of uniform samples, or by a set of parameters (innovations) that provide these samples. The switch between the two representations is performed by using the Annihilating Filter technique, which may be reduced to the "inverse" operation of the sampling operation.

As discussed above, the noiseless matrix A in Equation 13 is of rank K whenever L≧K. The singular value decomposition (SVD) of A may be provided, where $A=USV^T$, and forcing to zero the L+1−K smallest diagonal coefficients of the matrix S to yield S'. The resulting matrix $A'=US'V^T$ is not Toeplitz anymore but its best Toeplitz approximation is obtained by averaging the diagonals of A'. This leads to a new "denoised" sequence $\hat{y}_n'$ that matches the noiseless FRI sample model better than the original $\hat{y}_n$'s. A few of these iterations lead to samples that can be expressed almost exactly as samples of an FRI signal. This FRI signal is the closest to the noiseless one as A is closer to a square matrix, i.e., $L = \lfloor B\tau/2 \rfloor$. The computational cost of this algorithm, summarized below, is however higher than the previous annihilating filter method described in relation with noiseless signals, since it requires performing the SVD of a square matrix of large size, typically half the number of samples.

We will now describe a possible aspect of the Cadzow's iterative denoising method for converting a noisy sequence of samples $y_n$ in a noiseless or less noisy sequence $y'_n$ corresponding to a FRI, or nearly FRI, signal.

1) Compute the N-DFT coefficients of the samples $$\hat{y}_m = \sum_{n=1}^{N} y_n e^{-j2\pi mn/N};$$

2) Choose an integer L in [K, Bτ/2] and build the rectangular Toeplitz matrix A according to Equation 13;
3) Perform a singular value decomposition of $A=USV^T$ where U is a (2M−L+1)×(L+1) unitary matrix, S is a diagonal (L+1)×(L+1) matrix, and V is a (L+1)×(L+1) unitary matrix
4) Build the diagonal matrix S' from S by keeping only the K most significant diagonal elements, and deduce the total least-squares approximation of A by $A'=US'V^T$;
5) Build a denoised approximation $\hat{y}_n'$ of $\hat{y}_n$ by averaging the diagonals of the matrix A';
6) Iterate step 2 until a condition is met, for example until the $(K+1)^{th}$ largest diagonal element of S is smaller than the $K^{th}$ largest diagonal element by a pre-requisite factor depending on the requested accuracy and/or computing time. The iterations may also be repeated a predefined number of times, or until a desired signal to noise ratio of a reconstructed signal has been reached, or when a desired level of accuracy of the information relative to the another signal x(t) has been reached.

Other methods than a singular value decomposition may be used for finding the coefficients of the annihilating filter, including methods based on the solution of a linear system of equation.

For many applications, a small number of iterations, typically less than 10, is sufficient. Experimentally, the best choice for L in step 2 is L=M.

Uncertainty Relation for the One-Dirac Case

Let's consider the finite rate of innovation problem of finding $[x_1, t_1]$ from a set of N noisy samples $[y_1, y_2, \ldots, y_N]$ $$y_n = \mu_n + \epsilon_n \text{ with } \mu_n = x_1 \phi(n\tau/N - t_1) \tag{16}$$

where $\phi(t)$ is the τ-periodic, B-bandlimited Dirichlet kernel and $\epsilon_n$ is a stationary Gaussian noise. Any unbiased algorithm that estimates $t_1$ and $x_1$ will do so up to an error quantified by their standard deviation $\Delta t_1$ and $\Delta x_1$, lower bounded by Cramér-Rao formulae. Denoting the noise power by $\sigma^2$ and the Peak signal-to-noise ratio by $PSNR=|x_1|^2/\sigma^2$, two cases may be considered:

If the noise is white, i.e. its power spectrum density is constant and equals $\sigma^2$, then:

$$\frac{\Delta t_1}{\tau} \geq \frac{1}{\pi} \sqrt{\frac{3B\tau}{N(B^2\tau^2 - 1)}} \cdot PSNR^{-1/2} \tag{17}$$

and $$\frac{\Delta x_1}{|x_1|} \geq \sqrt{\frac{B\tau}{N}} \cdot PSNR^{-1/2}$$

If the noise is a white noise filtered by $\phi(t)$, then we find $$\frac{\Delta t_1}{\tau} \geq \frac{1}{\pi}\sqrt{\frac{3}{B^2\tau^2 - 1}} \cdot PSNR^{-1/2} \quad (18)$$

and $$\frac{\Delta x_1}{|x_1|} \geq PSNR^{-1/2}$$

In both configurations, we conclude that in order to minimize the uncertainty on $t_1$, it is better to maximize the bandwidth of the Dirichlet kernel, i.e., to choose the bandwidth B of the sampling kernel such that $B\tau = N$ if N is odd, or such that $B\tau = N-1$ if N is even. Since $B\tau \leq N$ we always have the following uncertainty relation $$N \cdot PSNR^{1/2} \cdot \frac{\Delta t_1}{\tau} \geq \frac{\sqrt{3}}{\pi} \quad (19)$$

involving the number of measurements N, the end noise level and the uncertainty on the position.

Extra Denoising: Other than Cadzow

The above described Cadzow denoising process outputs a signal with an improved signal-to-noise ratio, but in which the parameters (for example the location of the Diracs and their amplitude) are still noisy. The main advantage of this process is to deliver a signal which is parametric, i.e., a signal with a Finite Rate of Innovation, or at least a signal with a substantially Finite Rate of Innovation, or sufficiently close for the intended purpose to a signal with a Finite Rate of Innovation. The Cadzow process is thus not only a denoising process that merely improves the SNR ratio, in the way a Wiener filter for example would perform, but also projects the signal into the subspace of FRI signals for which reconstruction methods are available.

However, other denoising process and methods may be used in the framework of the disclosure. As a particular denoising process, we already mentioned the singular value decomposition that can be used to get a rank K approximation to the noisy matrix, which is a subspace approximation. Other subspace techniques, in particular variants based on the ESPRIT algorithm and/or on wavelets arrays, may be used for reducing the level of noise and for finding parameters of the signal one wants to reconstruct or for which one wants to retrieve information. In this case, the denoising and estimation of information relating to the another signal ($x_t$) may be combined in one common process.

Figure 4:
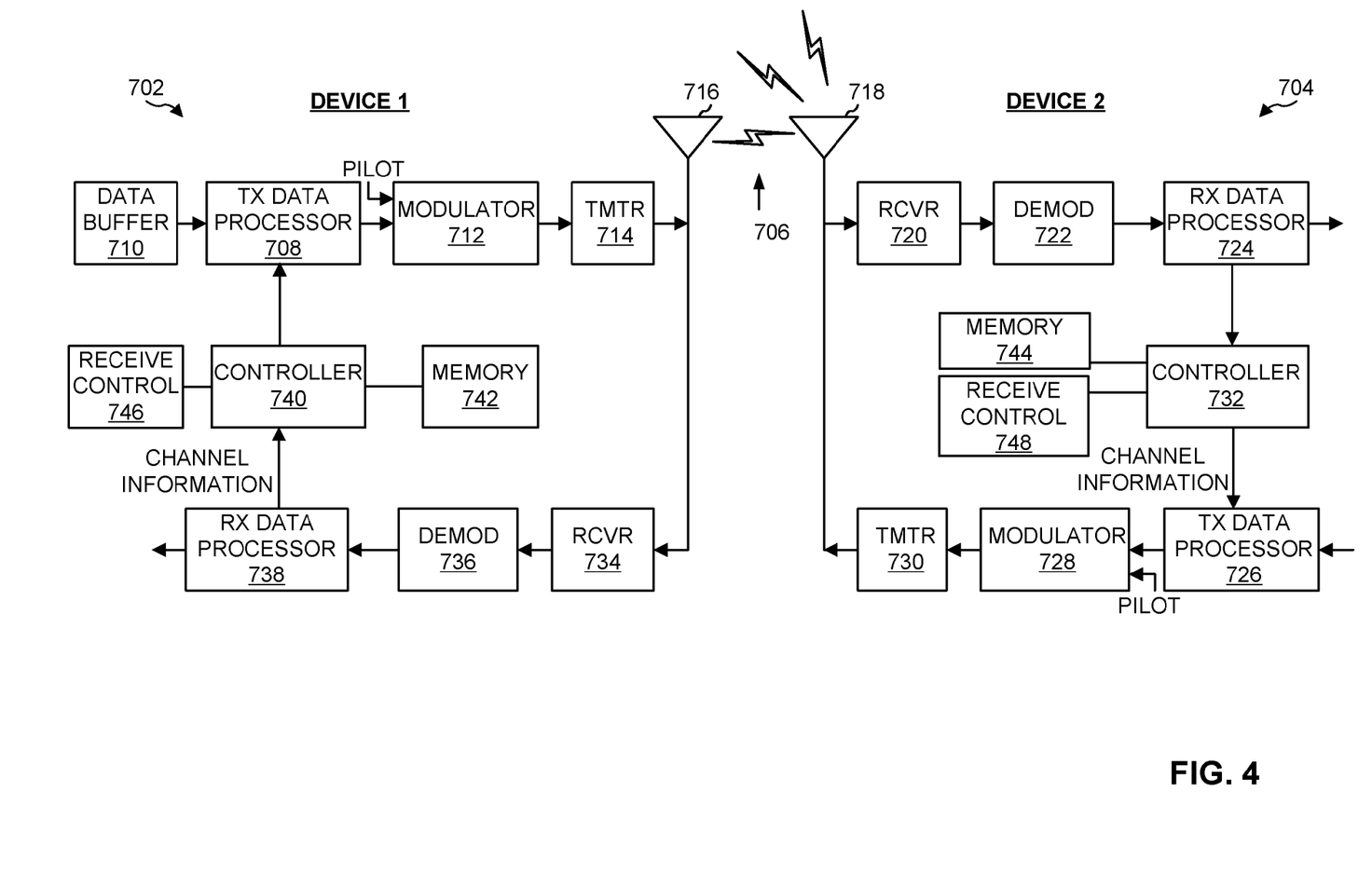
FIG. 4 is a simplified block diagram of several sample aspects of communication components.

The teachings herein may be incorporated into a device employing various components for communicating with at least one other device. FIG. 4 depicts several sample components that may be employed to facilitate communication between devices. Here, a first device 702 and a second device 704 are adapted to communicate via a communication link 706, for example a wireless communication link, over a suitable medium.

Initially, components involved in sending information from the device 702 to the device 704 (e.g., a reverse link) will be treated. A transmit ("TX") data processor 708 receives traffic data (e.g., data packets) from a data buffer 710 or some other suitable component. The transmit data processor 708 processes (e.g., encodes, interleaves, and symbol maps) each data packet based on a selected coding and modulation scheme, and provides data symbols. In general, a data symbol is a modulation symbol for data, and a pilot symbol is a modulation symbol for a pilot (which is known a priori). A modulator 712 receives the data symbols, pilot symbols, and possibly signaling for the reverse link, and performs modulation (e.g., OFDM, PPM or some other suitable modulation) and/or other processing as specified by the system, and provides a stream of output chips. A transmitter ("TMTR") 714 processes (e.g., converts to analog, filters, amplifies, and frequency upconverts) the output chip stream and generates a modulated signal, which is then transmitted from an antenna 716.

The modulated signals transmitted by the device 702 (along with signals from other devices in communication with the device 704) are received by an antenna 718 of the device 704. Noise may be added during the transmission over the channel and/or during reception. A receiver ("RCVR") 720 processes (e.g., conditions and digitizes) the received signal from the antenna 718 and provides received samples. A demodulator ("DEMOD") 722 processes (e.g., demodulates and detects) the received samples and provides detected data symbols, which may be a noisy estimate of the data symbols transmitted to the device 704 by the other device(s). A receive ("RX") data processor 724 processes (e.g., symbol demaps, deinterleaves, and decodes) the detected data symbols and provides decoded data associated with each transmitting device (e.g., device 702).

Components involved in sending information from the device 704 to the device 702 (e.g., a forward link) will be now be treated. At the device 704, traffic data is processed by a transmit ("TX") data processor 726 to generate data symbols. A modulator 728 receives the data symbols, pilot symbols, and signaling for the forward link, performs modulation (e.g., OFDM or some other suitable modulation) and/or other pertinent processing, and provides an output chip stream, which is further conditioned by a transmitter ("TMTR") 730 and transmitted from the antenna 718. In some implementations signaling for the forward link may include power control commands and other information (e.g., relating to a communication channel) generated by a controller 732 for all devices (e.g. terminals) transmitting on the reverse link to the device 704.

At the device 702, the modulated signal transmitted by the device 704 is received together with noise by the antenna 716, conditioned and digitized by a receiver ("RCVR") 734, and processed by a demodulator ("DEMOD") 736 to obtain detected data symbols. A receive ("RX") data processor 738 processes the detected data symbols and provides decoded data for the device 702 and the forward link signaling. A controller 740 receives power control commands and other information to control data transmission and to control transmit power on the reverse link to the device 704.

The controllers 740 and 732 direct various operations of the device 702 and the device 704, respectively. For example, a controller may determine an appropriate filter, reporting information about the filter, and decode information using a filter. Data memories 742 and 744 may store program codes and data used by the controllers 740 and 732, respectively.

FIG. 4 also illustrates that the communication components may include one or more components that perform operations as taught herein. For example, a receive control component 746 may cooperate with the controller 740 and/or other components of the device 702 to receive information from another device (e.g., device 704). Similarly, a receive control component 748 may cooperate with the controller 732 and/or other components of the device 704 to receive information from another device (e.g., device 702).

A wireless device may include various components that perform functions based on signals that are transmitted by or received at the wireless device or other signals as taught herein. For example, a wireless headset may include a transducer arranged to provide an audio output based on estimated information, retrieved parameters, or at least one sample as discussed above. A wireless watch may include a user interface arranged to provide an indication based estimated information, retrieved parameters, or at least one sample as discussed above. A wireless sensing device may include a sensor arranged to sense (e.g., to provide data to be transmitted) based on estimated information, retrieved parameters, or at least one sample as discussed above (e.g., received information that controls the sensing). The teachings herein may also be applied to optical or galvanic transmission channels, including optical transmission over optical fibers.

A wireless device may communicate via one or more wireless communication links that are based on or otherwise support any suitable wireless communication technology. For example, in some aspects a wireless device may associate with a network. In some aspects the network may comprise a body area network or a personal area network (e.g., an ultra-wideband network). In some aspects the network may comprise a local area network or a wide area network. A wireless device may support or otherwise use one or more of a variety of wireless communication technologies, protocols, or standards such as, for example, UWB, CDMA, TDMA, OFDM, OFDMA, WiMAX, and Wi-Fi. Similarly, a wireless device may support or otherwise use one or more of a variety of corresponding modulation or multiplexing schemes. A wireless device may thus include appropriate components (e.g., air interfaces) to establish and communicate via one or more wireless communication links using the above or other wireless communication technologies. For example, a device may comprise a wireless transceiver with associated transmitter and receiver components that may include various components (e.g., signal generators and signal processors) that facilitate communication over a wireless medium.

In some aspects a wireless device may communicate via an impulse-based wireless communication link. For example, an impulse-based wireless communication link may utilize ultra-wideband pulses that have a relatively short length (e.g., on the order of a few nanoseconds or less) and a relatively wide bandwidth. In some aspects the ultra-wideband pulses may have a fractional bandwidth on the order of approximately 20% or more and/or have a bandwidth on the order of approximately 500 MHz or more.

The teachings herein may be incorporated into (e.g., implemented within or performed by) a variety of apparatuses (e.g., devices). For example, one or more aspects taught herein may be incorporated into a phone (e.g., a cellular phone), a personal data assistant ("PDA"), an entertainment device (e.g., a music or video device), a headset (e.g., headphones, an earpiece, etc.), a microphone, a medical sensing device (e.g., a biometric sensor, a heart rate monitor, a pedometer, an EKG device, a smart bandage, etc.), a user I/O device (e.g., a watch, a remote control, a light switch, a keyboard, a mouse, etc.), an environment sensing device (e.g., a tire pressure monitor), a computer, a point-of-sale device, an entertainment device, a hearing aid, a set-top box, a "smart" bandage, or any other suitable device.

The methods and apparatus disclosed in this document are especially useful, without being limited to, the processing of sparse signals, i.e. signals with a low rate of innovation as compared with the bandwidth.

As already mentioned, the methods and apparatus of the application may also be used for ultra-wide band (UWB) communications. This communications method may use pulse position modulation (PPM) with very wideband pulses (up to several gigahertz of bandwidth). Designing a digital receiver using conventional sampling theory would require analog-to-digital conversion (ADC) running at very high frequencies, for example over 5 GHz. Such a receiver would be very expensive in terms of price and power consumption. A simple model of an UWB pulse is a Dirac convolved with a wideband, zero mean pulse. At the receiver, the signal is the convolution of the original pulse with the channel impulse response, which includes many reflections, and all this buried in high levels of noise.

More generally, the methods and devices disclosed in this document are especially useful for sparse signals, i.e. signals with a low rate of innovation as compared to the bandwidth, be it in time and/or in space. The methods are however not limited to sparse signals and may be used for any signal with a finite rate of innovation, including bandlimited signal.

Differently from the methods used by known compressed sensing tools, compressed sensing framework, the methods are not limited to discrete values; indeed, the innovation times $t_k$ and the weights $c_k$ used and retrieved by the methods may assume arbitrary real values.

These devices may have different power and data requirements. In some aspects, the teachings herein may be adapted for use in low power applications (e.g., through the use of an impulse-based signaling scheme and low duty cycle modes) and may support a variety of data rates including relatively high data rates (e.g., through the use of high-bandwidth pulses).

In some aspects a wireless device may comprise an access device (e.g., a Wi-Fi access point) for a communication system. Such an access device may provide, for example, connectivity to another network (e.g., a wide area network such as the Internet or a cellular network) via a wired or wireless communication link. Accordingly, the access device may enable another device (e.g., a Wi-Fi station) to access the other network or some other functionality. In addition, it should be appreciated that one or both of the devices may be portable or, in some cases, relatively non-portable.

Figure 5A:
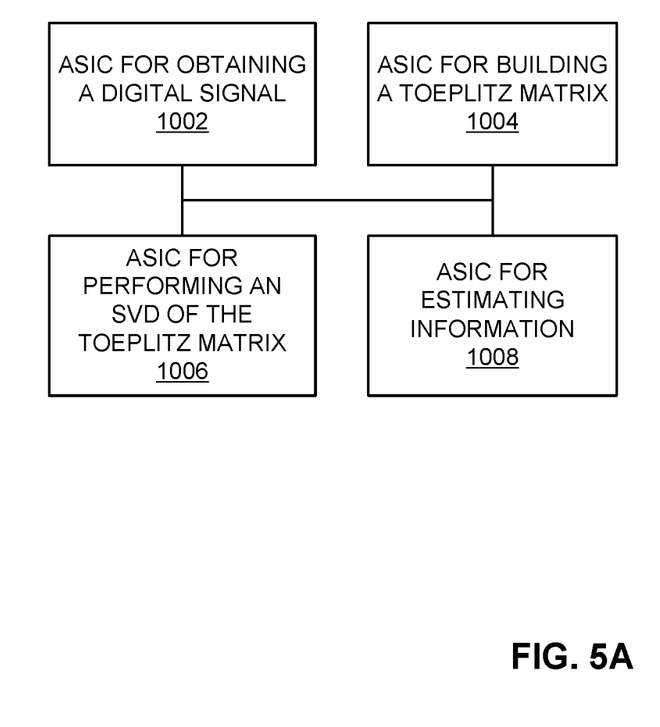
FIGS. 5A and 5B are simplified block diagrams of several sample aspects of apparatuses configured to provide signal acquisition and reconstruction as taught herein.
Figure 5B:
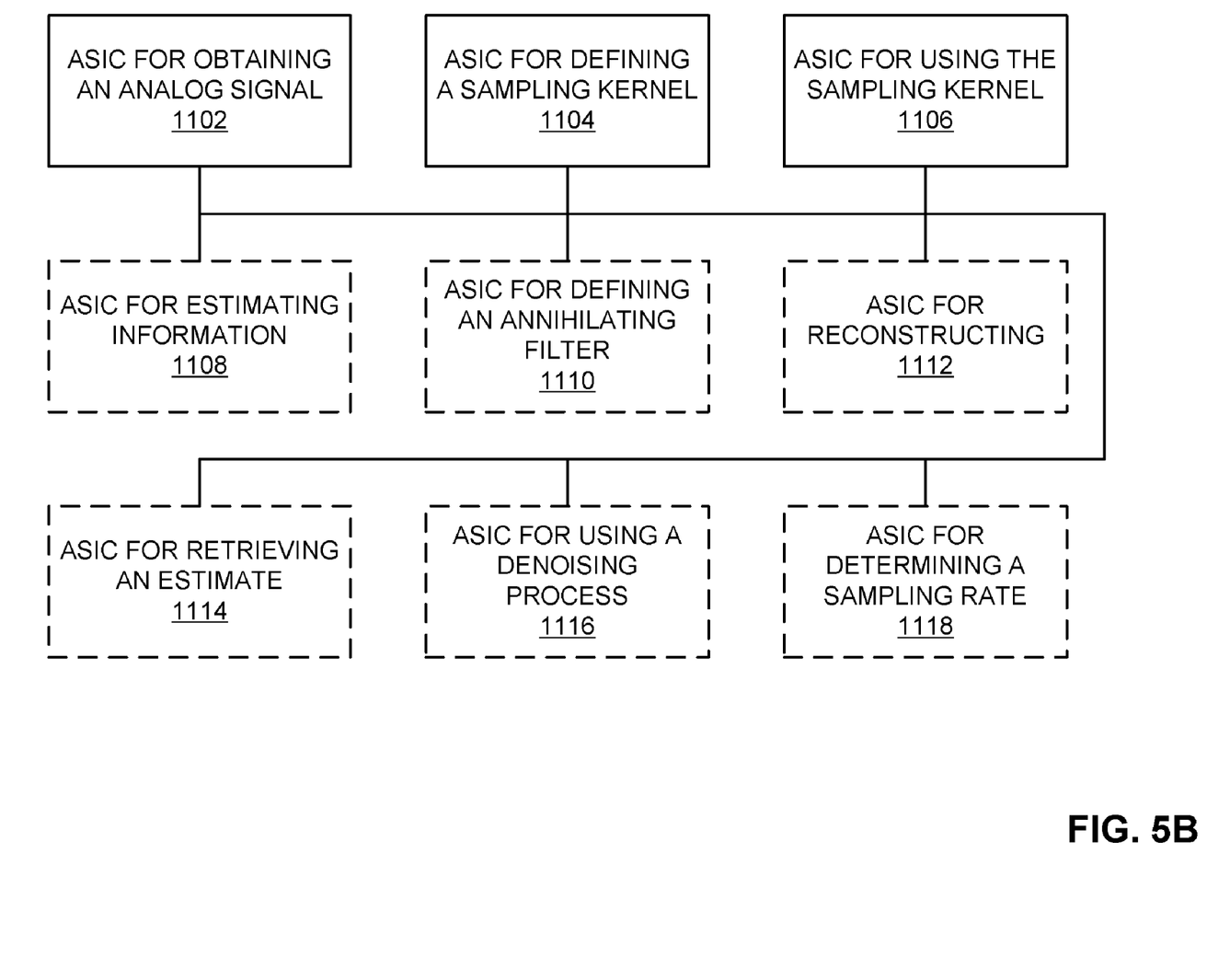

The components described herein may be implemented in a variety of ways. Referring to FIGS. 5A and 5B, apparatuses 800, 900, 1000, and 1100 are represented as a series of interrelated functional blocks that may represent functions implemented by, for example, one or more integrated circuits (e.g., an ASIC) or may be implemented in some other manner as taught herein. As discussed herein, an integrated circuit may include a processor, software, other components, or some combination thereof.

The apparatuses 800, 900, 1000, and 1100 may include one or more modules that may perform one or more of the functions described above with regard to various figures. For example, an ASIC for obtaining a digital signal 802, 902, or 1002 may correspond to, for example, a sampler and/or one or more other components as discussed herein. An ASIC for estimating information 804, 1008, or 1108 may correspond to, for example, a processor and/or one or more other components as discussed herein. An ASIC for determining a sampling rate 806 or 1118 may correspond to, for example, an estimator and/or one or more other components as discussed herein. An ASIC for defining a sampling kernel 808 or 1104 may correspond to, for example, an estimator and/or one or more other components as discussed herein. An ASIC for converting the digital signal 904 may correspond to, for example, a denoiser and/or one or more other components as discussed herein. An ASIC for retrieving parameters 906 may correspond to, for example, a processor and/or one or more other components as discussed herein. An ASIC for building a Toeplitz matrix 1004 may correspond to, for example, a processor and/or one or more other components as discussed herein. An ASIC for performing an SVD of the Toeplitz matrix 1006 may correspond to, for example, a processor and/or one or more other components as discussed herein. An ASIC for obtaining an analog signal 1102 may correspond to, for example, a receiver and/or one or more other components as discussed herein. An ASIC for using a sampling kernel 1106 may correspond to, for example, a sampler and/or one or more other components as discussed herein. An ASIC for defining an annihilating filter 1110 may correspond to, for example, a processor and/or one or more other components as discussed herein. An ASIC for reconstructing 1112 may correspond to, for example, a processor and/or one or more other components as discussed herein. An ASIC for retrieving an estimate 1114 may correspond to, for example, a processor and/or one or more other components as discussed herein. An ASIC for using a denoising process 1116 may correspond to, for example, a denoiser and/or one or more other components as discussed herein.

As noted above, in some aspects these components may be implemented via appropriate processor components. These processor components may in some aspects be implemented, at least in part, using structure as taught herein. In some aspects a processor may be adapted to implement a portion or all of the functionality of one or more of these components. In some aspects one or more of the components, especially components represented by dashed boxes, are optional.

As noted above, apparatuses 800, 900, 1000, and 1100 may comprise one or more integrated circuits. For example, in some aspects a single integrated circuit may implement the functionality of one or more of the illustrated components, while in other aspects more than one integrated circuit may implement the functionality of one or more of the illustrated components.

In addition, the components and functions represented by FIGS. 5A and 5B as well as other components and functions described herein, may be implemented using any suitable means. Such means also may be implemented, at least in part, using corresponding structure as taught herein. For example, the components described above in conjunction with the "ASIC for" components of FIGS. 5A and 5B also may correspond to similarly designated "means for" functionality. Thus, in some aspects one or more of such means may be implemented using one or more of processor components, integrated circuits, or other suitable structure as taught herein. The methods described and claimed may be carried, at least in part, using software modules carried out by suitable processing means.

Also, it should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements. In addition, terminology of the form "at least one of: A, B, or C" used in the description or the claims means "A or B or C or any combination thereof."

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that any of the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The steps of a method or algorithm described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects any suitable computer-program product may comprise a computer-readable medium comprising codes (e.g., executable by at least one computer) relating to one or more of the aspects of the disclosure. In some aspects a computer program product may comprise packaging materials.

The previous description of the disclosed aspects is provided to enable any person skilled in the art to make or use the present disclosure. Various modifications to these aspects will be readily apparent to those skilled in the art, and the generic principles defined herein may be applied to other aspects without departing from the scope of the disclosure. Thus, the present disclosure is not intended to be limited to the aspects shown herein but is to be accorded the widest scope consistent with the principles and novel features disclosed herein.

What is claimed is:

1. A method of processing a signal which is received by a receiver, comprising:
   obtaining an analog signal ($y_t$) based on another signal ($x_t$) and noise;
   defining a sampling kernel based on the noise; and
   using the sampling kernel to obtain at least one sample ($y_n$) from the analog signal ($y_t$).

2. The method of claim 1, wherein a sampling rate for obtaining the at least one sample ($y_n$) is lower than the minimal sampling rate given by the Shannon theorem applied to the analog signal ($y_t$).

3. The method of claim 1, wherein bandwidth of the sampling kernel is based on an estimate of the noise.

4. The method of claim 1, further comprising estimating information relating to the another signal ($x_t$) through the use of an annihilating filter.

5. The method of claim 4, further comprising defining the annihilating filter by performing a singular value decomposition method and minimizing a norm of a matrix associated with the singular value decomposition method.

6. The method of claim 1, further comprising reconstructing the another signal ($x_t$) through use of an annihilating filter applied to the at least one sample ($y_n$).

7. The method of claim 1, further comprising retrieving an estimate of shifts ($t_k$) associated with the another signal ($x_t$) through use of an annihilating filter.

8. The method of claim 7, further comprising retrieving an estimate of weights ($x_k$) associated with the another signal ($x_t$).

9. The method of claim 1, further comprising using a denoising process to provide a denoised signal ($y'_n$) based on the at least one sample ($y_n$).

10. The method of claim 1, further comprising determining a sampling rate for obtaining the at least one sample ($y_n$) based on an estimate of the noise.

11. The method of claim 10, wherein the estimated noise comprises an estimated signal-to-noise ratio.

12. The method of claim 10, wherein the determination of the sampling rate is further based on a desired level of accuracy for reconstructing the another signal ($x_t$).

13. The method of claim 10, wherein the determination of the sampling rate is further based on a comparison between an assumption of an expected signal to noise ratio and a signal to noise ratio of a reconstructed signal that is based on the at least one sample ($y_n$).

14. An apparatus for signal processing, comprising:
   a circuit arranged to obtain an analog signal ($y_t$) based on another signal ($x_t$) and noise; and
   a sampler arranged to use a sampling kernel that is defined based on the noise to obtain at least one sample ($y_n$) from the analog signal ($y_t$).

15. The apparatus of claim 14, wherein a sampling rate for obtaining the at least one sample ($y_n$) is lower than the minimal sampling rate given by the Shannon theorem applied to the analog signal ($y_t$).

16. The apparatus of claim 14, wherein bandwidth of the sampling kernel is based on an estimate of the noise.

17. The apparatus of claim 14, further comprising an estimator arranged to estimate information relating to the another signal ($x_t$) through use of an annihilating filter.

18. The apparatus of claim 17, wherein the estimator is further arranged to define the annihilating filter by performing a singular value decomposition method and minimizing a norm of a matrix associated with the singular value decomposition method.

19. The apparatus of claim 14, further comprising an estimator arranged to reconstruct the another signal ($x_t$) through use of an annihilating filter applied to the at least one sample ($y_n$).

20. The apparatus of claim 14, further comprising an estimator arranged to retrieve an estimate of shifts ($t_k$) associated with the another signal ($x_t$) through use of an annihilating filter.

21. The apparatus of claim 20, wherein the estimator is further arranged to retrieve an estimate of weights ($x_k$) associated with the another signal ($x_t$).

22. The apparatus of claim 14, further comprising a denoiser arranged to provide a denoised signal ($y'_n$) based on the at least one sample ($y_n$).

23. The apparatus of claim 14, arranged to determine a sampling rate for obtaining the at least one sample ($y_n$) based on an estimate of the noise.

24. The apparatus of claim 23, wherein the estimated noise comprises an estimated signal-to-noise ratio.

25. The apparatus of claim 23, wherein the determination of the sampling rate is further based on a desired level of accuracy for reconstructing the another signal ($x_t$).

26. The apparatus of claim 23, wherein the determination of the sampling rate is further based on a comparison between an assumption of an expected signal to noise ratio and a signal to noise ratio of a reconstructed signal that is based on the at least one sample ($y_n$).

27. An apparatus for signal processing, comprising:
   means for obtaining an analog signal ($y_t$) based on another signal ($x_t$) and noise;
   means for defining a sampling kernel based on the noise; and
   means for using the sampling kernel to obtain at least one sample ($y_n$) from the analog signal ($y_t$).

28. The apparatus of claim 27, wherein a sampling rate for obtaining the at least one sample ($y_n$) is lower than the minimal sampling rate given by the Shannon theorem applied to the analog signal ($y_t$).

29. The apparatus of claim 27, wherein bandwidth of the sampling kernel is based on an estimate of the noise.

30. The apparatus of claim 27, further comprising means for estimating information relating to the another signal ($x_t$) through the use of an annihilating filter.

31. The apparatus of claim 30, further comprising means for defining the annihilating filter by performing a singular value decomposition method and minimizing a norm of a matrix associated with the singular value decomposition method.

32. The apparatus of claim 27, further comprising means for reconstructing the another signal ($x_t$) through use of an annihilating filter applied to the at least one sample ($y_n$).

33. The apparatus of claim 27, further comprising means for retrieving an estimate of shifts ($t_k$) associated with the another signal ($x_t$) through use of an annihilating filter.

34. The apparatus of claim 33, further comprising means for retrieving an estimate of weights ($x_k$) associated with the another signal ($x_t$).

35. The apparatus of claim 27, further comprising means for using a denoising process to provide a denoised signal ($y'_n$) based on the at least one sample ($y_n$).

36. The apparatus of claim 27, further comprising means for determining a sampling rate for obtaining the at least one sample ($y_n$) based on an estimate of the noise.

37. The apparatus of claim 36, wherein the estimated noise comprises an estimated signal-to-noise ratio.

38. The apparatus of claim 36, wherein the determination of the sampling rate is further based on a desired level of accuracy for reconstructing the another signal ($x_t$).

39. The apparatus of claim 36, wherein the determination of the sampling rate is further based on a comparison between an assumption of an expected signal to noise ratio and a signal to noise ratio of a reconstructed signal that is based on the at least one sample ($y_n$).

40. A computer readable medium embodying a computer program product for signal processing, said computer program product comprising codes executable to:

obtain an analog signal ($y_t$) based on another signal ($x_t$) and noise;

define a sampling kernel based on the noise; and use the sampling kernel to obtain at least one sample ($y_n$) from the analog signal ($y_t$).

41. A headset, comprising:

a circuit arranged to obtain an analog signal ($y_t$) based on another signal ($x_t$) and noise;

a sampler arranged to use a sampling kernel that is defined based on the noise to obtain at least one sample ($y_n$) from the analog signal ($y_t$); and a transducer arranged to provide an audio output based on the at least one sample ($y_n$).

42. A watch, comprising:

a circuit arranged to obtain an analog signal ($y_t$) based on another signal ($x_t$) and noise;

a sampler arranged to use a sampling kernel that is defined based on the noise to obtain at least one sample ($y_n$) from the analog signal ($y_t$); and a user interface arranged to provide an indication based on the at least one sample ($y_n$).

43. A sensing device, comprising:

a circuit arranged to obtain an analog signal ($y_t$) based on another signal ($x_t$) and noise;

a sampler arranged to use a sampling kernel that is defined based on the noise to obtain at least one sample ($y_n$) from the analog signal ($y_t$); and a sensor arranged to sense based on the at least one sample ($y_n$).

* * * * *